United States Patent [19]
Page

[11] 3,728,496
[45] Apr. 17, 1973

[54] THIN FILM TRANSISTOR PHONOGRAPH AMPLIFIER

[75] Inventor: Derrick J. Page, Pittsburgh, Pa.

[73] Assignee: Westinghouse Electric Corporation, Pittsburgh, Pa.

[22] Filed: May 5, 1970

[21] Appl. No.: 34,843

[52] U.S. Cl.................179/100.4 A, 179/1 A, 330/35
[51] Int. Cl............G11b 3/00, H03f 1/08, H03f 3/16
[58] Field of Search..................330/35; 179/100.4 A, 179/100.4 ST, 1 A

[56] References Cited

UNITED STATES PATENTS 3,512,100 5/1970 Killion et al...........................330/35

FOREIGN PATENTS OR APPLICATIONS 1,086,812 10/1967 Great Britain.......................179/1 A

OTHER PUBLICATIONS

Popular Electronics – May, 1967 – Pages 85–86
"The TFT – A New Thin-Film Transistor" Proceedings of the ire June 1962 page 1463 only. By P. K. Weimer.
IBM Technical Disclosure Bulletin Vol. 11, No. 1, June, 1968, Pages 17–18.

*Primary Examiner*—Howard W. Britton
*Attorney*—F. Shapoe and C. L. Menzemer

[57] ABSTRACT

This disclosure relates to an electrical circuit for conducting a signal from a high impedance ceramic pick-up cartridge, as is used in a phonograph, to a thin film field effect transistor and then to a speaker via a matching transformer.

If desired, two thin film field effect transistors may be used and the signal fed directly to a speaker without employing a matching transformer.

5 Claims, 7 Drawing Figures

INVENTOR
Derrick J. Page

C L Menzemer
ATTORNEY

THIN FILM TRANSISTOR PHONOGRAPH AMPLIFIER

RELATED APPLICATIONS

The thin film field effect transistors used in this invention are set forth in detail in U.S. Patent application, Ser. No. 745,039.

BACKGROUND OF THE INVENTION

1. Field of the Invention

This invention is in the field of electronic circuitry and in particular in the field of a phonograph amplifier circuit.

2. Description of the Prior Art

Simple phonographs have been developed to the point where a signal from a high impedance pick-up cartridge is fed to the grid of a pentode tube which in turn feeds power to a speaker through a matching transformer.

Attempts have been made to build an equivalent solid state circuit but they have not been successful.

It is not possible to build an equivalent circuit using a bipolar transistor or transistors since bipolar transistors require a base current which cannot be supplied by the ceramic cartridge.

If a silicon field effect transistor is used, additional biasing networks are required because Junction and Schottky barrier devices are normally "on" and an MOS device is normally "off."

Furthermore, the electrical characteristics of such devices are non-linear and would introduce distortion.

An object of this invention is to provide a simplified solid state phonograph amplifier circuit.

A further object of this invention is to provide a simplified solid state phonograph amplifier circuit in which a signal from a high impedance ceramic pick-up cartridge is fed to thin film, field effect transistor and from there to a speaker via a matching transformer.

A still further object of this invention is to provide a simplified solid state phonograph amplifier circuit in which a signal from a high impedance ceramic pick-up cartridge is fed to first thin film field effect transistor, then to a second thin film field effect transistor and from there to a speaker without the necessity of a matching transformer.

Other objects will, in part, be obvious and will, in part, appear hereinafter.

SUMMARY OF THE INVENTION

In accordance with the present invention and attainment of the foregoing objects there is provided a phonograph amplifier circuit comprising a power supply, a thin film field effect transistor and a matching transformer and speaker connected across the terminals of the power supply and a high impedance pick-up cartridge having a first contact connected to a gate contact of the field effect transistor and a second contact connected to a common terminal with a source contact of the field effect transistor and one of the terminals of the power supply.

DESCRIPTION OF THE DRAWING

For a better understanding of the nature and objects of the invention reference should be had to the following detailed description and drawing in which.

DESCRIPTION OF THE PREFERRED EMBODIMENTS

Figure 1:
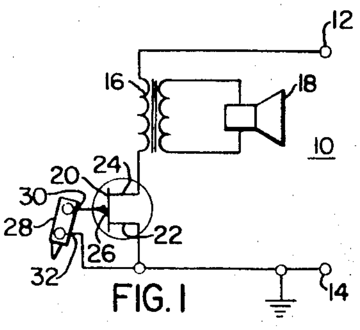
FIG. 1 is a schematic drawing of one embodiment of the circuit of this invention.

With reference to FIG. 1, there is shown in the form of a schematic diagram a thin film, field effect transistor phonograph amplifier circuit 10 setting forth the teachings of this invention.

The circuit 10 has electrical power supply terminals 12 and 14. A matching transformer 16, a speaker 18 coupled to the matching transformer 16, and a thin film, field effect transistor (TFFET) 20 are connected in an electrical series circuit relationship across the terminals 12 and 14.

The thin film field effect transistor (TFFET) 20, which will be described in detail hereinbelow has a source contact 22, a drain contact 24, and a gate contact 26.

A high impedance ceramic pick-up cartridge 28 has one terminal 30 electrically connected to gate contact 26 of TFFET 20, and a second terminal 32 electrically connected to a common terminal with source contact 22 of TFFET 20 and power input terminal 14.

In operation, a signal from the pick-up cartridge 28 is fed to the gate contact 26 of the TFFET 20.

Matching transformer 16 for the speaker 18 is connected between the drain contact 24 of TFFET 20 and power input terminal 12.

If an n-type TFFET is employed in the circuit, terminal 12 should be positive relative to terminal 14. If a p-type TFFET is employed in the circuit terminal 12 should be negative with respect to terminal 14.

Figure 2:
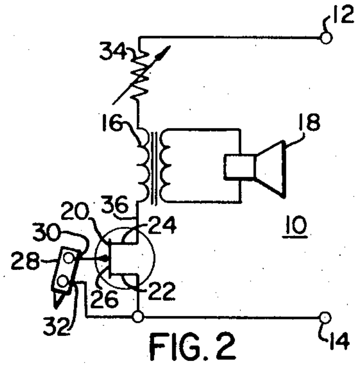
FIG. 2 is a schematic drawing of a modification of the embodiment shown in FIG. 1.

With reference to FIG. 2, a variable resistor 34 may be connected electrically in series with the power supply, in drain lead 36, to act as a volume control. Or, and with reference to FIG. 3, a variable resistor 38 can be electrically connected in series in source lead 40 to control volume. A third method of controlling the volume would be to vary the power supply voltage.

Figure 3:
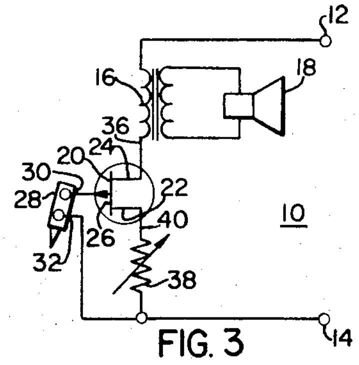
FIG. 3 is a schematic drawing of another modification of the embodiment shown in FIG. 1.

The amount of power that can be obtained from the circuit of FIGS. 1 to 3 is limited by the impedance of the pick-up cartridge. If the transistor is made large in order to increase the output power, the input capacitance also increases. If the size of the transistor is increased too much, the input capacitance will load down the cartridge and decrease the signal. Experience has shown that presently using a TFFET having a capacitance of 500 pF, an operating voltage of 10 volts from a power supply, an input voltage from the cartridge of 1 volt root mean square and a speaker with either a load impedance of 25 ohms or a load impedance of 25 ohms as seen through the matching transformer, the power input to the load will be 1.25 watts. This power is considered ample for most applications.

The thin film, field effect transistor (TFFET) 20 of the circuit of this invention is described and discussed in detail in U.S. Patent application, Ser. No. 747,064 filed June 24, 1968, the assignee of which is the same as that of the present invention.

Figure 4:
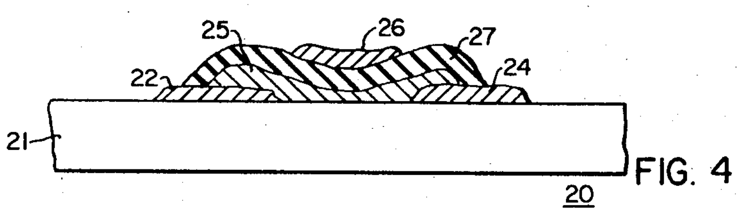
FIGS. 4 and 5 are side views, partially in section, of the thin film field effect transistor used in accordance with the teachings of the invention.

Briefly and with reference to FIG. 4, there is shown a thin film field effect transistor 20 on a flexible substrate suitable for use in accordance with the teachings of this invention.

The transistor 10 consists of a substrate 21, a source contact or electrode 22, a drain contact or electrode 24, a layer of semiconductor material 25, a layer of electrical insulation 27 and a gate contact or electrode 26.

The substrate may be of any of the known substrate materials such as polished glass, sapphire or a quartz body.

Preferably however, the substrate may be of a flexible material.

A flexible substrate may be of any flexible material such as for example, paper, polyethylene terephthlate sold commercially under the trademark Mylar; esters and ethers of cellulose such as ethyl cellulose; cellulose acetate; and cellulose nitrate; regenerated cellulose such as cellophane; polyvinyl chloride; polyvinyl chloride-acetate; polyvinylidene chloride, sold commercially under the trademark Saran; nylon film polyimide and polyamide-imide films, polytetrafluoroethylene, sold commercially under the trademark Teflon, polytrifluoromonochloroethylene, sold commercially under the trademark Kel F; and flexible tapes and foils of the metals: nickel, aluminum, copper, tin, tantalum and base alloys of any of these, and ferrous base alloys such for example as thin gauge stainless steel strip. Because of the heat to be dissipated during operation of the circuit of this invention, the flexible substrate is preferably a metal tape. Aluminum tape is especially satisfactory.

The term "flexible," as used in describing the substrate, means a material that can be wrapped around a mandrel of, at the maximum, one inch in diameter and preferably a mandrel of the order of one-eighth inch in diameter using such flexible substrates having FET's of the type shown in FIG. 1, they have been bent into radii as small as one-sixteenth inch without degradation of operating characteristics.

Figure 5:
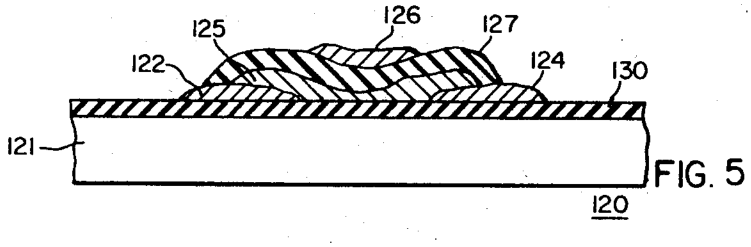

With reference to FIG. 5, there is shown a modified FET device 120. When the substrate 121 of the device 120 is a flexible metal foil or tape, a layer 130 of an electrically insulating material, to insulate the TFFET from the substrate, is disposed on the substrate 121 before the device is fabricated.

Depending on the metal comprising the substrate, the insulation layer 130 may be an anodic oxide of the tape metal itself, as for example, aluminum oxide if the metal substrate 121 is aluminum, or the insulation may be any of the cured electrically insulating resinous materials which are used as insulators on electrically conductive wire such for example as polyvinyl formed phenolic resins sold under the trademark Formex, epoxy resins including mixtures with polyamides-imides and polyimide resins such as are set forth in U.S. Pat. Nos. 3,179,630 and 3,179,635.

With reference again to FIG. 4, and equally applicable to FIG. 5, the source 22 and 122 and drain 24 and 124 are disposed upon the flexible substrate 21 or upon the insulation layer 130 of the substrate 121 and spaced apart from each other. The distance between the source and drain is not critical and depends on the properties desired. The source electrode 22 and 122 and drain electrode 24 and 124 may be of any suitable electrically conductive metal, such as a metal selected from the group consisting of gold, silver, aluminum, nickel and base alloys thereof. The source electrode 22 and 122 and drain electrode 24 and 124 should have a thickness sufficient to insure their functioning as ohmic contacts. A thickness of from 80 A to 500 A and preferably from 100 A to 300 A has been found satisfactory for most devices.

The layer of semiconductor material 25 and 125 extends between the source electrode 22 and drain electrode 24. The layer 25 and 125 of semiconductor material is in contact with and extends between the source electrode 22 and 122 and drain electrode 24 and 124. Preferably the layer 25 and 125 partially overlaps the source 22 and 122 and drain 24 and 124. The layer 25 may consist of a semiconductor material, such for example, as tellurium, cadmium sulfide, cadmium selenide, silicon, indium arsenide, gallium arsenide, tin oxide and lead telluride. The layer 25 and 125 may be single crystal, polycrystalline or amorphous.

The thickness of the semiconductor layer 25 and 125 must be such that the device operates in both enhancement and depletion. For a p-type material, such as tellurium, a thickness of from 100 A to 300 A, preferably about 125 A is satisfactory. For an n-type material such as cadmium sulfide a thickness of from 100 A to 3,000 A is satisfactory.

The insulation layer 27 and 127 does not have to completely cover layer 25 and 125 of semiconductor material and extend from the source electrode 22 and 122 to the drain electrode 24 and 124, it need only insulate the gate electrode 26 and 126 from the semiconductor layer 25 and 125.

The insulation layer 27 and 127 may be comprised of a suitable electrical insulating material selected from the group consisting of inorganic insulators such as silicon monoxide, silicon dioxide, aluminum oxide, calcium fluoride, magnesium fluoride and polymerizable organics such as polymers of hexachlorobutadiene, divinyl benzene, aryl sulfones, fluorinated alkenyls (e.g. polytetrafluoroethylene) and para-xylene.

The insulation layer 27 and 127 should be as thin as possible so that modulation can be produced in the device current at a relatively low voltage. However, the layer must serve as an adequate electrical insulator. A layer of 100 A has occasionally been found to contain pin holes which adversely effect the electrical insulation function of the layer. A thickness of about 300 A appears to be the minimum thickness which will ensure that there are no pin holes while 1,000 A appears to be optimum between a void free insulation layer and low voltage modulation. As the operating voltage of the device increases to 100 volts, a thickness of about 3,000 A is desirable and at an operating voltage of 200 volts a thickness of about 500 A to 6,000 A is desirable.

The gate electrode 26 and 126 is disposed on the insulation layer 27 and 127 between the source electrode 22 and 122 and the drain electrode 24 and 124.

The gate electrode 26 and 126 consists of a good electrically conductive metal such as a metal selected from the group consisting of aluminum, copper, tin, silver, gold and platinum. In order to ensure that the gate electrode 26 and 126 provides a high conductivity, it should have a thickness of from 300 A to 1,000 A and preferably from 500 to 1,000 A.

Field effect transistors of the type shown in FIGS. 4 and 5 have stable operating characteristics and have worked at frequencies up to 60 MHz. Such transistors have been operated for over 1,000 hours without any substantial measurable change of characteristics.

Broadly to prepare the TFFET 20 used in this invention the substrate, preferably a flexible metal tape is disposed in a vacuum chamber, then a metal, for example gold or one of the other metals designated above, is evaporated through the stencil to form the source and drain electrodes. A second stencil is then substituted and a semiconductor material, such as tellurium or one of the other semiconductor materials listed above, is evaporated to form the semiconductor region which extends between the source and drain electrodes. The stencil is again changed and an electrical insulation layer, as for example, a layer of silicon monoxide, is evaporated to form the gate insulator. Finally, through a fourth stencil the gate contact, of aluminum or other suitable metal, is evaporated onto the insulation layer.

Figure 6:
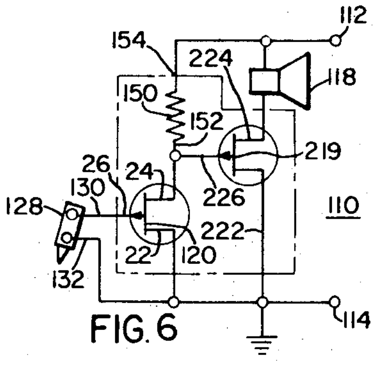
FIG. 6 is a schematic drawing of another embodiment of the circuit of this invention.

If a power output of more than can be achieved by the amplifier circuit of FIG. 1, about 1.25 watts, is desired, it can be obtained from the amplifier circuit of FIG. 6.

Circuit 110 of FIG. 6 has power supply terminals 112 and 114. A speaker 118 and a power thin film, field effect transistor (PTFFET) 219 are connected in an electrical series circuit relationship across the terminals 112 and 114. The drain electrode 224 of power thin film, field effect transistor 219 is connected to one terminal of the speaker 118. The other terminal of the speaker 118 is connected to power supply terminal 112. Source terminal or electrode 222 of PTFFET is connected to power terminal 114.

A second thin film field effect transistor (TFFET) 120, which is the same device as TFFET 20 of FIG. 1, and a resistance 150 are connected in an electrical series circuit relationship across terminals 112 and 114.

Drain electrode or terminal 24 of TFFET 120 is connected to a first terminal 152 of resistance 150. A second terminal 154 of resistance 150 is connected to power supply terminal 112. The drain terminal 24 of TFFET 120 and terminal 152 of resistance 150 are connected to gate terminal 226 of PTFFET 219.

Source terminal 22 of TFFET 120 is connected to power terminal 114.

A high impedance ceramic pick-up cartridge 128 has one terminal 130 connected to gate terminal 26 of TFFET 120 and a second terminal 132 connected to power supply terminal 114.

The use of PTFFET 219 having an impedance of from 10 to 100 ohms allows the impedance of TFFET 120, about 2,000 ohms, to be matched to the impedance of speaker 118 without the necessity of using a matching transformer.

The thin film field effect transistor 120 of the circuit of FIG. 6 is the same transistor described in conjunction with the circuit of FIG. 1.

The power thin film field effect transistor 219 of FIG. 6 has been built with power densities of up to 80 watts per square centimeter and frequencies of up to 1 MHz. and higher.

Figure 7:
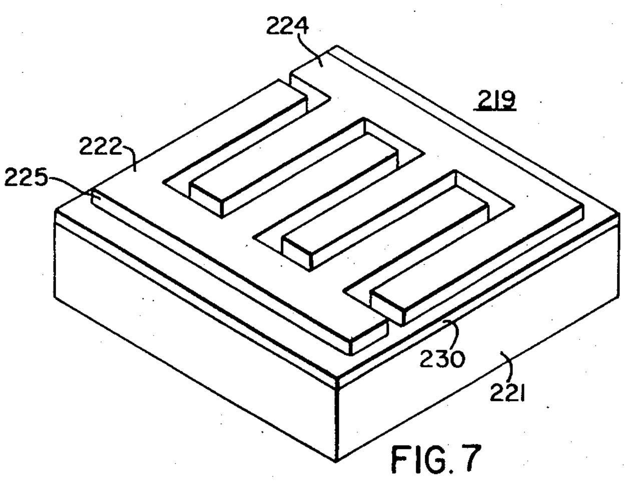
FIG. 7 is a side view, partially in section, of another thin film field effect transistor used in accordance with the teaching of this invention.

With reference to FIG. 7, there is shown one type of power, thin film, field effect transistor 219 suitable for use in accordance with the teachings of this invention.

The PTFFET 219 consists of an aluminum foil or block 221 which acts as a gate and on which has been formed a layer of insulation 230 of such for example as aluminum oxide. The oxide insulation layer 230 may have a thickness of from 500 to 1,000 A and serves as a gate insulator.

There is a layer of semiconductor material 225 disposed on the insulation layer 230. The semiconductor material may be any of those set forth above for TFFET's 20 and 120. Suitable examples include tellurium for a p-type channel and cadmium selenide (CdSe) for an n-type channel.

A source 222 and drain 224 contact having interdigitated configuration is disposed on the semiconductor material.

As a rough approximation, 1 mm of channel width is required for 10 mA of current, hence a 1 ampere device requires a channel width of ten centimeters.

Reference should be had to U.S. Patent application, Ser. No. 34,842, filed May 5, 1970, for a detailed discussion of the power, thin film field effect transistor.

With reference to FIGS. 1 and 7, that portion of the structure enclosed within the dotted line can be built on a single substrate.

The circuit of this invention makes possible the building of a miniature amplifier circuit which can be used in phonographs or other sound producing equipment.

I claim as my invention:

1. An amplifier circuit consisting of power supply terminals, a thin film field effect transistor, a speaker, means for matching the impedance of the transistor with the impedance of the speaker and a high impedance pick-up cartridge, the transistor, and impedance matching means with the speaker coupled thereto being connected in a series circuit relationship between said power terminals, said pick-up cartridge having a first terminal connected to a gate contact of the transistor and a second contact connected to a common terminal with a source contact of the transistor and one of the power supply terminals.

2. The circuit of claim 1 in which the means for matching the impedance of the transistor with the impedance of the speaker is a power, thin film, field effect transistor.

3. The circuit of claim 1 in which a variable resistor is connected in series with the source contact and the common terminal.

4. The circuit of claim 1 in which the means for matching the impedance of the transistor with the impedance of the speaker is a matching transformer.

5. The circuit of claim 4 in which a variable resistor is connected in series between the matching transformer and power supply terminal.

* * * * *